United States Patent
Evain et al.

(10) Patent No.: US 9,520,899 B2
(45) Date of Patent: Dec. 13, 2016

(54) METHOD FOR GENERATING A MAXIMIZED LINEAR CORRECTING CODE, METHOD AND DEVICE FOR DECODING SUCH A CODE

(71) Applicant: COMMISARIAT A L'ENERGIE ATOMIQUE ET AUX ENERGIES ALTERNATIVES, Paris (FR)

(72) Inventors: Samuel Evain, Saclay (FR); Valentin Gherman, Palaiseau (FR)

(73) Assignee: COMMISARIAT A L'ENERGIE ATOMIQUE ET AUX ENERGIES ALTERNATIVES, Neuilly sur Seine (FR)

(*) Notice: Subject to any disclaimer, the term of this patent is extended or adjusted under 35 U.S.C. 154(b) by 15 days.

(21) Appl. No.: 14/362,081

(22) PCT Filed: Nov. 12, 2012

(86) PCT No.: PCT/EP2012/072392
§ 371 (c)(1),
(2) Date: May 30, 2014

(87) PCT Pub. No.: WO2013/079306
PCT Pub. Date: Jun. 6, 2013

(65) Prior Publication Data
US 2014/0344652 A1 Nov. 20, 2014

(30) Foreign Application Priority Data

Dec. 2, 2011 (FR) .................................... 11 61124

(51) Int. Cl.
*H03M 13/03* (2006.01)
*H03M 13/13* (2006.01)
(Continued)

(52) U.S. Cl.
CPC ......... *H03M 13/13* (2013.01); *H03M 13/1148* (2013.01); *H03M 13/1575* (2013.01)

(58) Field of Classification Search
CPC .................... H03M 13/1575; H03M 13/1148
See application file for complete search history.

(56) References Cited

U.S. PATENT DOCUMENTS 3,328,759 A 6/1967 Blaauw et al.
3,755,779 A 8/1973 Price
(Continued)

OTHER PUBLICATIONS

L Baccarini, et al., "Error-Correction Techniques and Adaptive Linearization in SDH Radio", European Conference on Radio Relay Systems, Oct. 11, 1993, pp. 238-243, vol. CONF. 4, IEE, London, GB, XP006513627.

(Continued)

*Primary Examiner* — M. Mujtaba Chaudry
(74) *Attorney, Agent, or Firm* — Baker & Hostetler LLP

(57) ABSTRACT

A method is provided for generating a maximized linear correcting code from a base linear correcting code, the base correcting code and the maximized linear correcting code being associated with one and the same parity matrix H, the matrix being used to generate syndromes, the syndromes being used for decoding code words. The method comprises a step of identifying the syndromes unused for decoding the base linear correcting code, a step of identifying the errors that can affect the code words and make it possible to obtain the unused syndromes when a code word is multiplied by the matrix H and a step of selecting a unique error for each unused syndrome from among the identified errors, the error being called additional error.

7 Claims, 3 Drawing Sheets

(51) Int. Cl.
*H03M 13/15* (2006.01)
*H03M 13/11* (2006.01)

(56) References Cited

U.S. PATENT DOCUMENTS

| | | | |
|---|---|---|---|
| 4,397,022 A | | 8/1983 | Weng et al. |
| 4,493,081 A | * | 1/1985 | Schmidt ................ G06F 11/106 |
| | | | 714/54 |
| 5,923,680 A | * | 7/1999 | Brueckheimer ...... H04L 1/0057 |
| | | | 714/758 |
| 7,020,811 B2 | * | 3/2006 | Byrd ....................... H04L 1/004 |
| | | | 714/52 |
| 2002/0157044 A1 | * | 10/2002 | Byrd ....................... H04L 1/004 |
| | | | 714/703 |
| 2003/0066014 A1 | * | 4/2003 | Van Dijk ............... G11B 20/18 |
| | | | 714/774 |
| 2005/0154966 A1 | | 7/2005 | Blaum |
| 2007/0214402 A1 | | 9/2007 | Heiman et al. |
| 2008/0148129 A1 | * | 6/2008 | Moon ................... H03M 13/15 |
| | | | 714/758 |
| 2008/0222487 A1 | * | 9/2008 | Matsumoto ........... H04L 1/0057 |
| | | | 714/758 |
| 2009/0169015 A1 | * | 7/2009 | Watanabe ............. H04L 9/0858 |
| | | | 380/278 |
| 2010/0017684 A1 | | 1/2010 | Yang |

OTHER PUBLICATIONS

Saeed Shamshiri, et al., Error-Locality-Aware Linear Coding to Correct Multi-bit Upsets in SRAM, Center for Domain Specific Computing, IEEE International Test Conference, Oct. 11, 2010, 1 page.

* cited by examiner

METHOD FOR GENERATING A MAXIMIZED LINEAR CORRECTING CODE, METHOD AND DEVICE FOR DECODING SUCH A CODE

CROSS-REFERENCE TO RELATED APPLICATIONS

This application is a National Stage of International patent application PCT/EP2012/072392, filed on Nov. 12, 2012, which claims priority to foreign French patent application No. FR 1161124, filed on Dec. 2, 2011, the disclosures of which are incorporated by reference in their entirety.

FIELD OF THE INVENTION

The aim of the invention is a method for generating a maximized linear correcting code, a method and a device for decoding such a code. It notably applies to the fields of error-correcting codes and nanoscale technology.

BACKGROUND

In a digital system, data are usually stored in a digital memory in the form of binary values called bits. Errors can appear in the stored data and can be transient or permanent, as explained below. If these errors are not corrected or masked, they can generate operating errors and finally the failure of the system.

Transient errors are produced by interference with the environment or are due to the intrinsic features of memories produced using nanoscale technology.

Permanent errors are the consequence of defects in the physical structure of the circuits, these defects appearing during the production of the circuits and/or because of aging. A high density of hardware defects in a memory system translates into a large number of permanent errors.

In order to guarantee an acceptable level of integrity of the stored data and/or to increase efficiency of production, certain electronic systems use codes, usually denoted by the acronym ECC standing for "Error Correcting Codes" or EDAC standing for "Error Detection And Correction" codes.

In digital memories benefiting from protection of the ECC type, the data are encoded upon being written into the memory. Upon the encoding of data with an ECC code, verification bits, also called redundancy bits, are added to the data bits in order to form code words.

The code words of a linear correcting code are defined using a parity matrix H. A binary vector V is a code word only if its product with the matrix H generates a zero vector.

Upon reading the data present in a memory, each linear code word V is verified by evaluating the dot product HV. The result of this operation is a vector also called syndrome. If the syndrome is a zero vector, the code word is considered correct. A non-zero syndrome indicates the presence of at least one error. If the syndrome makes it possible to identify the positions of the affected bits, the code word is corrected.

Various linear ECC codes can be employed with various error detecting and correcting capacities. By way of example, Hamming encoding makes it possible to correct a single error, i.e. an error that affects only one bit. This correction capacity is known as SEC, an acronym for the expression "Single Error Correction".

Another example of an ECC code is the DEC code, an acronym for the expression "Double Error Correction". A DEC code allows the correction of double errors, i.e. errors affecting two bits in a code word. Of course, the codes of this family are also capable of correcting a single error.

The theoretically attainable correction capacity of the ECC codes usually used is rarely used. This is due to the fact that the number N of data bits in a code word stored in a memory is usually a power of 2. In other words, $N=k*2^n$, in which expression n and k are integers. N is therefore a multiple of a power of 2.

By way of illustration, if a SEC code is used, the number c of verification bits must satisfy the following condition:

$$2^c - 1 \geq N + c \quad (1)$$

If the data words to be protected are such that N=32, then the number of verification bits required is c=6.

The number $\Delta$ of syndromes unused by a linear SEC code for correcting single errors can be determined by using the following expression:

$$\Delta = 2^c - N - c - 1 \quad (2)$$

In the case of the SEC code chosen as an example, this number of unused syndromes is $\Delta=25$.

This number $\Delta$ of unused syndromes means that up to $\Delta$ different multiple errors can be corrected in addition to the single errors that can be corrected by the SEC code.

More generally, the number $\Delta$ of syndromes unused by a linear ECC code as syndromes allowing the correction of a number EC of single or multiple errors can be determined using the following expression:

$$\Delta = 2^c - EC - 1 \quad (3)$$

In the case of a DEC code used to protect words comprising N=32 data bits, the use of 12 verification bits is necessary. A code word therefore has a size of 44 bits. As a consequence, a DEC code must be able to correct 44 single errors and $(43 \times 44)/2=946$ double errors. As a consequence, a number of EC=990 single and double errors are correctable and the expression (3) indicates that the unused correction capacity is of $\Delta=2^{12}-990-1=3105$ errors.

For a given number of verification bits, the theoretically attainable correction capacity not being entirely used. Thus, the remaining margin can be made use of in order to allow the correction of certain additional errors. In the description, the expression "base code" refers to a linear ECC code that an attempt is made to modify by improving its correction capacity. This improvement is made possible by implementing a mechanism of correction of so-called additional errors. An additional error refers to an error that is not corrected by the base code but is corrected once said code has been improved.

Thus, certain double errors can be corrected in the case of SEC codes and certain triple errors can be corrected in the case of DEC codes.

SEC codes allowing the correction of single errors as well as the correction of a restricted number of double errors have notably been the subject of several patents. By way of example, the reader is referred to patents U.S. Pat. No. 3,755,779 and U.S. Pat. No. 3,328,759 in which coding methods are described in which an additional verification bit is added to the number of verification bits necessary for implementing a traditional SEC code. In these examples, double errors affecting pairs of bits of adjacent positions are corrected. The theoretically attainable correction capacity is however far from being entirely used.

DEC codes allowing the correction of single and double errors as well as the correction of a restricted number of errors affecting more than two bits have been proposed in the article by S. Shamshiri and K.-T. Cheng *Error-locality-*

*aware linear coding to correct multi-bit upsets* in SRAM, IEEE International Test Conference, 2010. The use of this type of code allows the correction of errors involving more than two bits of adjacent positions in the code word or of errors present in a restricted group of bits of adjacent positions. Here again, the theoretically attainable correction capacity is far from being attained.

SUMMARY OF THE INVENTION

An aim of the invention is notably to remedy the aforementioned defects.

With this aim, the subject of the invention is a method for generating a maximized linear correcting code from a base linear correcting code, the base correcting code and the maximized linear correcting code being associated with one and the same parity matrix H, said matrix being used to generate syndromes, said syndromes being used for decoding code words.

The method a step of identifying the syndrome or syndromes unused for decoding the base linear correcting code, said syndromes called additional syndromes being used for decoding the maximized linear correcting code, a step of identifying the errors that can affect the code words and make it possible to obtain said additional syndromes when a code word is multiplied by the matrix H, a step of selecting a unique error for each additional syndrome from among the identified errors, said error being called additional error.

According to one aspect of the invention, the selection step can use a criterion of choice of at least one error per additional syndrome, the selected error being associated with a greater probability of occurrence than the probability of occurrence of the other errors associated with the same additional syndrome.

According to another aspect of the invention, the selection step can use a criterion of choice of at least one error per additional syndrome, the selected error being chosen from among the errors associated with one and the same additional syndrome so that the number of bits of the code word affected by this error is minimal.

According to another aspect of the invention, the selection step can use a criterion of choice of at least one error from among the errors associated with one and the same additional syndrome so that the number of data bits of the code word affected by this error is minimal.

In an embodiment, the selection step uses a criterion of choice of one error from among the errors associated with one and the same additional syndrome so that all the data bits or all the bits of the code word are affected by the same number of errors.

Another subject of the invention is for decoding code words generated using a maximized linear correcting code obtained by the generation method described previously, and including a step of determining a syndrome from a code word; a step verifying whether said syndrome is associated with an additional error or a conventional error and determining the error associated with said syndrome; a step of correcting the identified error.

Another subject of the invention is a device for decoding code words generated using a maximized linear correcting code obtained by the method described previously, said device including means for determining a syndrome from a code word, means for identifying whether said syndrome is an additional syndrome, means for determining the additional error associated with the unused syndrome and for correcting it when such a syndrome is identified.

The invention notably has the advantage of improving the correction capacity of the linear ECC codes usually used to protect the data stored in a memory without the number of verification bits being increased.

BRIEF DESCRIPTION OF THE DRAWINGS

Other features and advantages of the invention will appear upon reading the following description, given for illustrative and non-limiting purposes and made with reference to the appended drawings among which.

DETAILED DESCRIPTION

Figure 1:
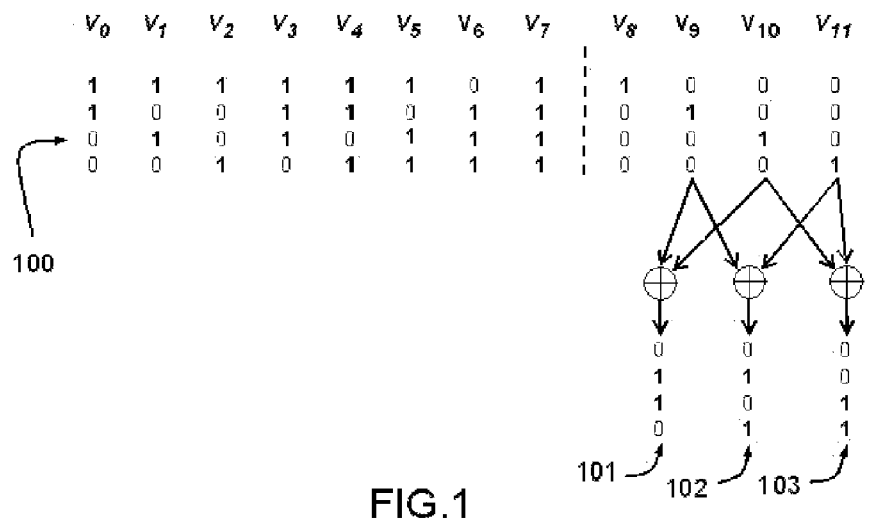
FIG. 1 gives an example of a parity matrix H associated with a correcting code of SEC type and some syndromes unused for the correction of single errors.

FIG. 1 gives an example of a parity matrix H 100 associated with a correcting code of SEC type and some syndromes unused for correcting single errors. The code employed using this matrix provides the correction of the single errors that can occur on all the bits of the code word. Each of the columns of the matrix corresponds to the syndrome of a single error affecting the bit of the code word having the corresponding position, i.e. the bit of the code word with the same index as the column of the matrix.

In this example a code word comprises c=4 verification bits and N=8 data bits. The eight data bits of a code word are denoted $V_0$ to $V_7$ and the four verification bits $V_8$ to $V_{11}$.

The use of expression (2) shows that it is possible to correct up to Δ=3 additional multiple errors in addition to the single errors that can already have been corrected. It is for example possible to choose to correct the following additional errors:

the double error affecting the bits $V_9$ and $V_{10}$ and corresponding to one of the three unused syndromes 101;

the double error affecting the bits $V_9$ and $V_{11}$ and corresponding to another of the three unused syndromes 102;

the double error affecting the bits $V_{10}$ and $V_{11}$ and corresponding to another of the three unused syndromes 103.

In summary, in addition to the correction of single errors affecting the code word, three double errors are correctable out of the sixty-six possible double errors.

Figure 2:
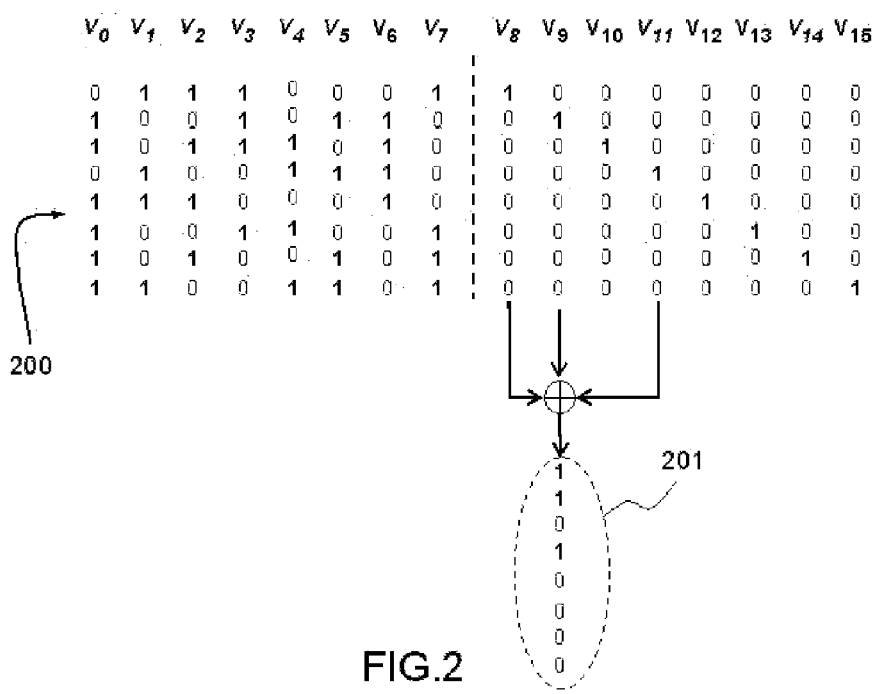
FIG. 2 gives an example of a parity matrix H associated with an error-correcting code of DEC type and a syndrome unused for the correction of single or double errors.

FIG. 2 gives an example of a parity matrix H 200 associated with an error-correcting code of DEC type and of a syndrome unused for the correction of single or double errors. This code allows the correction of single errors and double errors that can affect all the bits of code words. In this example, the code words have a length of sixteen bits and comprise N=8 data bits $V_0$ to $V_7$ and c=8 verification bits $V_8$ to $V_{15}$. There are therefore sixteen single errors and one hundred and twenty double errors possible. Each column of the matrix 200 corresponds to the syndrome of the single error that can affect one out of the sixteen bits of the code word. The syndromes making it possible to identify the multiple errors are given by the modulo-2, i.e. bitwise, sum of the columns of the matrix 200 corresponding to the positions of the corrupted bits.

From the expression (3) it is possible to compute for this type of code the difference $\Delta=2^8-136-1=119$ which corresponds to the unused syndromes as syndromes aiming to correct the sixteen single errors and the one hundred and twenty double errors or to identify the case without error.

Thus up to $\Delta=119$ different multiple errors can be potentially corrected out of the five hundred and sixty possible triple errors. Among these errors, it is for example possible to choose to correct the triple error that can affect the bits $V_8$, $V_9$ and $V_{11}$ and corresponding to the syndrome 201.

Figure 3:
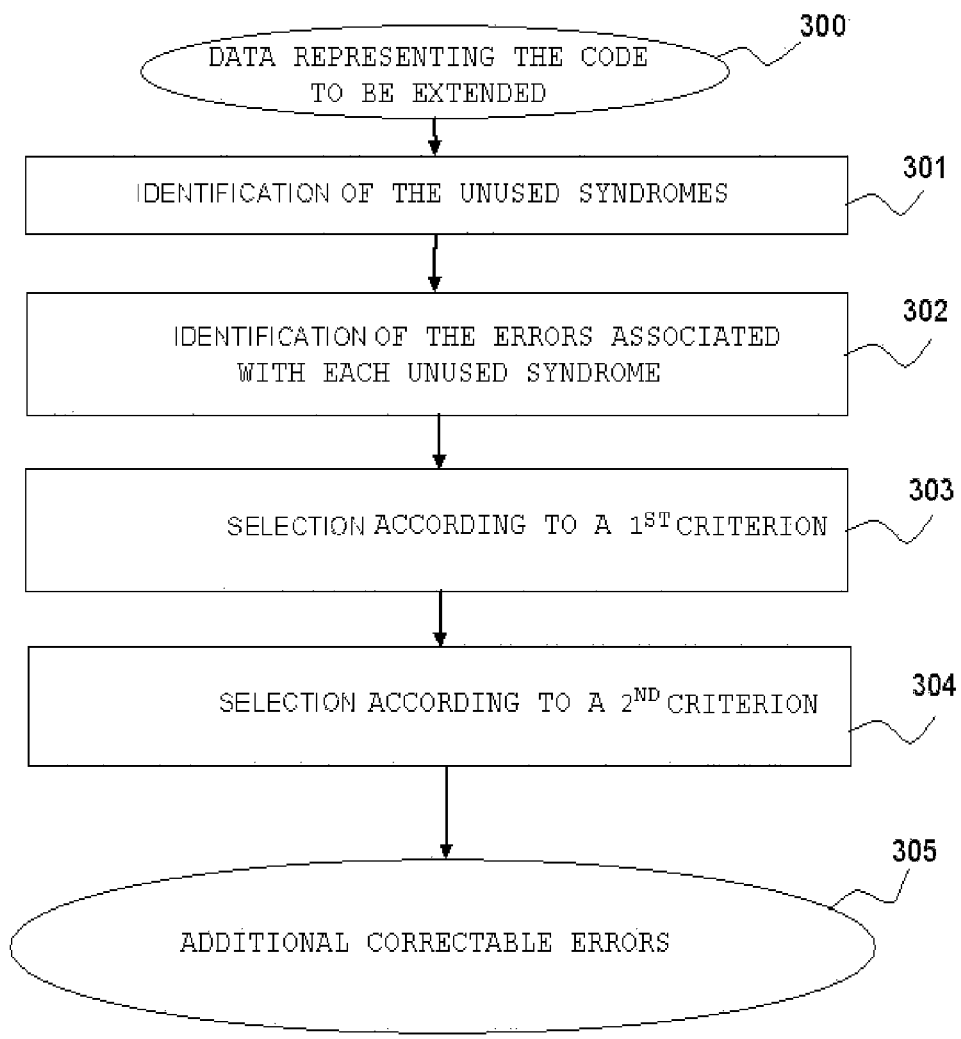
FIG. 3 gives an example of a method for generating a maximized linear correcting code.

FIG. 3 gives an example of a method for generating a maximized linear correcting code from a given parity matrix H.

This method makes it possible to improve the correction capacity of a base code. The correction capacity of the code before improvement is called base correction capacity.

The essential principle of this method is to associate additional errors in need of being corrected with all or part of the syndromes that are not used by the base code.

The way of associating an unused syndrome with an additional error to be corrected can rely on the use of one or more criteria of choice. Indeed, various errors affecting a code word can lead, after multiplication of said word with the parity matrix H, to the same unused syndrome. For this syndrome to be used, one of these additional errors will have to be selected, using for example one or more criteria defined below.

The method uses as inputs 300 the parity matrix H of the base code for which one wishes to extend the correction capacity as well as information relating to this code, such as for example the base correction capacity and the list of already correctable errors.

A first step 301 of the method aims to identify the syndromes used by the base code and to identify the unused syndromes with the aim of correcting additional errors. Said unused syndromes can be stored in a memory 301 in a list Lsynd for example.

In a second step 302 of the method, for each syndrome of the list Lsynd, a list Lerr of the additional errors generating this syndrome is constructed. There are therefore as many lists Lerr as unused syndromes contained in the list Lynd.

For each syndrome of the list Lsynd, one of the errors identified in the corresponding list Lerr is then selected, the error thus selected corresponding to a correctable additional error. This selection can be performed using various criteria.

It is possible to apply a single criterion or several criteria of selection combined together, these criteria having to be applied so as to identify a single additional error for each unused syndrome. Thus, upon decoding, the unused syndromes make it possible to correct errors that were not taken into account by the base code. The linear base ECC code is then maximized, i.e. the code thus derived from said base code has an optimized correction capacity close to the theoretical maximum.

Examples of criteria that can be applied are given below.

A first criterion of selection of one or more errors associated with an unused syndrome present in the list Lsynd is to find the error or errors in the list Lerr that have the greatest probability of appearance. The use of this criterion supposes that statistical information on the occurrence of the errors is available.

A second criterion of selection of one or more errors associated with an unused syndrome in the list Lsynd is to keep in the list Lerr only the errors affecting a minimum number of bits of the code word.

A third criterion of selection of one or more errors associated with an unused syndrome is to select only the errors of the list Lerr affecting as few data bits as possible. The errors that are not taken into account by the base code and affecting only the verification bits can be ignored.

A fourth criterion of selection of the errors associated with the unused syndromes is to choose an error from each list Lerr so that all the data bits or all the bits of the code word are affected by the same number of errors. As with the third criterion, the aim is to minimize the latency of the decoder of the maximized ECC code.

In the example in FIG. 3, two steps 303, 304 are applied so as to successively apply two additional error selection criteria. These two criteria consist for example firstly 303 in selecting the errors that affect a minimum number of bits of the code word, then secondly 304 in selecting from among the remaining errors an error or errors affecting a minimum number of data bits. The fourth criterion can then be applied to the lists Lerr that have more than one element.

The result of the application of the method is a list of unused syndromes with which correctable additional errors are associated. A maximized ECC code has thus been constructed.

Advantageously, the additional errors associated with the unused syndromes can be errors affecting more bits than the multiple errors already correctable by the base ECC code.

The code can be constructed by selecting a matrix H so that a particular class of multiple errors corresponds to syndromes unused by the base ECC code. Thus, when the method for generating a maximized linear ECC code is used, these multiple errors will be found in the lists Lerr, which will allow their selection, according to the selection criteria used.

Advantageously, the architecture of a memory component using a base code to protect its stored data does not need any modification to implement the maximized ECC code.

Figure 4:
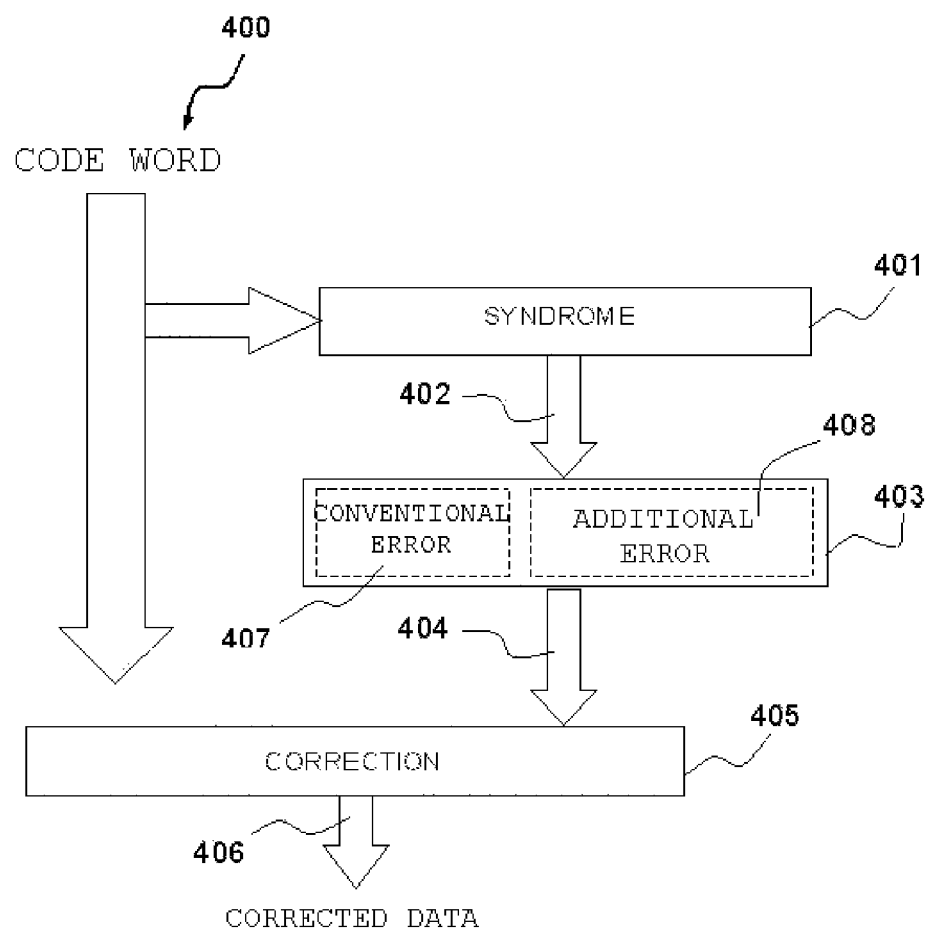
FIG. 4 gives an example of a device for decoding a maximized linear correcting code.

FIG. 4 gives an example of a device for decoding a maximized linear ECC code. The bits of the code words 400 are used as input of the device for generating 401 error syndromes 402. The bits of the syndromes 402 are then used for identifying 403 errors to be corrected. A syndrome 402 can be a conventional syndrome, i.e. a syndrome allowing the correction of an error correctable by the base code. A syndrome 402 can also be an unused syndrome. Thus, the decoding device comprises means for identifying if the syndrome is a syndrome unused by a base code and therefore for identifying if the code word comprises a conventional error 407 or else an additional error 408.

This identification translates into a word 404 the bits of which indicate the inversions of the value of the bits to be performed 405 on the code word 400 in order to obtain a corrected code word 406 or only the corrected data bits.

In such a device, all or only part of the syndromes unused by the base code can be made use of in order to allow the correction of the additional errors.

The invention claimed is:

1. A method for generating a maximized linear correcting code associated with a parity matrix H with a set of additional syndromes from a base linear correcting code with a decoding device, the base linear correcting code and the maximized linear correcting code being associated with the same parity matrix H, said method comprising:
   a step of identifying the set of additional syndromes not used for decoding the base linear correcting code with the decoding device, the set of additional syndromes being used for decoding the maximized linear correcting code, the set of additional syndromes being derived from syndromes used by the base linear correcting code;

a step of identifying errors from said set of additional syndromes with the decoding device when a code word affected by one of these errors is multiplied by the matrix H; and a step of determining a unique error with the decoding device identified by each additional syndrome of the set of additional syndromes from among the identified errors, said unique error comprising an additional error.

2. The method as claimed in claim 1, wherein the determination step uses a criterion of choice of at least one error per additional syndrome of the set of additional syndromes, the selected error being associated with a greater probability of occurrence than a probability of occurrence of other errors associated with the same additional syndrome.

3. The method as claimed in claim 1, wherein the determination step uses a criterion of choice of at least one error per additional syndrome of the set of additional syndromes, the selected error being chosen from among errors associated with one and the same additional syndrome so that a number of bits of the code word affected by this error is minimal.

4. The method as claimed in claim 1, wherein the determination step uses a criterion of choice of at least one error from among errors associated with one and the same additional syndrome so that a number of data bits of the code word affected by this error is minimal.

5. The method as claimed in claim 1, wherein the determination step uses a criterion of choice of one error from among errors associated with one and the same additional syndrome so that all data bits or all bits of the code word are affected by a same number of errors.

6. A method for decoding code words generated using a maximized linear correcting code obtained by the method as claimed in claim 1 and further comprising:

a step of determining a syndrome from a code word;

a step verifying whether said syndrome is associated with an additional error or a conventional error;

a step of determining the error associated with said syndrome; and a step of correcting the error.

7. A device for decoding code words generated using a maximized linear correcting code obtained by the method as claimed in claim 1, said device comprising:

a decoding device configured to determine a syndrome from a code word, the decoding device further configured to identify whether said syndrome is an additional syndrome, and the decoding device further configured to determine the error associated with the syndrome and for correcting the error.

* * * * *